US005462834A

United States Patent [19]

Weller, Jr. et al.

[11] Patent Number: 5,462,834
[45] Date of Patent: Oct. 31, 1995

[54] WATER BASED VARNISH FOR PRODUCTION OF COLORED IMAGES

[76] Inventors: Edward L. Weller, Jr., 1959 Robin Crest La., Glenview, Ill. 60025; Edward J. Renkor, 2 N. 565 Pearl Ave., Lyn Ellyn, Ill. 60137; Edward L. Weller, III, 1959 Robin Crest La., Glenview, Ill. 60025

[21] Appl. No.: 178,466

[22] Filed: Jan. 6, 1994

Related U.S. Application Data

[63] Continuation of Ser. No. 681,556, Apr. 5, 1991, abandoned, which is a continuation-in-part of Ser. No. 337,295, Apr. 13, 1989, abandoned, which is a continuation-in-part of Ser. No. 197,681, May 5, 1988, abandoned, which is a division of Ser. No. 867,956, May 29, 1986, Pat. No. 4,748,102.

[51] Int. Cl.$^6$ ..................................................... G03F 7/021
[52] U.S. Cl. ........................... 430/176; 430/143; 430/292; 430/293; 430/295
[58] Field of Search ..................................... 430/143, 176, 430/293, 292, 295

[56] References Cited

U.S. PATENT DOCUMENTS

| | | | |
|---|---|---|---|
| 3,999,993 | 12/1976 | Patel et al. | 430/289 |
| 4,273,842 | 6/1981 | Nonogaki et al. | 430/25 |
| 4,537,851 | 8/1985 | Nonogaki et al. | 430/144 |
| 4,578,341 | 3/1986 | Readings et al. | 430/143 |

FOREIGN PATENT DOCUMENTS 1447886  9/1976  United Kingdom .

OTHER PUBLICATIONS

"The Merck Index", 9th edition, Published by Merck & Co., Inc. 1976, pp. 61–62.

Primary Examiner—Charles L. Bowers, Jr.
Assistant Examiner—Christopher G. Young
Attorney, Agent, or Firm—Hopkins & Thomas

[57] ABSTRACT

Photographic images may be produced on a backing such as paper and polyester sheets, from photographic negatives which encompass line rendering, design comps, copy, complex color separation or the like with water-based varnishes and pigments, the resulting images closely resembling, if not exactly, the same image in its commercially printed form. Thus all aspects of color proofs produced by this invention provide greatly improved predictability as to the appearance of the final printed job, with a further improvement of cost savings over conventional techniques of preparing color proofs. Also, said proofing method can be used to provide a "transfer" so that one may transfer the colored image or images to a more suitable or required backing.

5 Claims, No Drawings

WATER BASED VARNISH FOR PRODUCTION OF COLORED IMAGES

This is a continuation of application Ser. No. 07/681,556 filed on Apr. 5, 1991, now abandoned, which is a continuation-in-part of application Ser. No. 337,295, filed on Apr. 13, 1989, now abandoned, which is a continuation-in-part of application Ser. No. 197,681, filed on May 5, 1988, now abandoned, which is a divisional of application Ser. No. 867,956, filed May 29, 1986, now U.S. Pat. No. 4,748,102, issued May 31, 1988.

BACKGROUND OF THE INVENTION

1. Field of the Invention

This invention relates to a method of producing colored images on various substrates. By first coating the substrate with a sealer and when dried, coating with a water based pigmented photo-sensitive coating; after drying, exposing this coating to ultraviolet light through a photographic negative, and developing this image by removing the unexposed portion with water. These colored images using this process are particularly useful in preparing direct images, transfer or rub off images, and can also be used in preparing pre-press proofs that more closely resemble actual press proofs or press runs than similar proofs from the techniques of the prior art.

2. Description of the Prior Art

The color printing industry is, of course, massively large, with billions of dollars going toward the creation of beautiful color reproductions of photographs for magazines, art work, sales brochures, and the like.

As a color print job is laid out, it is often necessary to prepare a color proof or composition for careful examination prior to going forward with the substantial expense of setting up the press for commercial printing of the color reproduction. The original art work might consist of a single negative or multi negatives for complex color work, or it might consist of accurate four color separations to reproduce process color images.

A disadvantage of the prior art process is that most direct imaging and transfer systems use solvent based ink solutions which contain flammable or hazardous materials. In addition, a clear solvent solution or solutions which are also flammable or hazardous must be used for these images to be developed after exposure to ultraviolet light.

When using the method which uses a solvent based ink, another disadvantage is that the system will not hold fine line detail which is necessary in many cases of reproductions of art work and mandatory when required to make a detailed four color process image.

In Lupo, U.S. Pat. No. 2,716,061, a pigmented contact printing emulsion is disclosed for use in reproducing multi-colored photographic images on flexible supports, and especially vinyl plastic sheets. While having some similarity to the invention of this application, the formulations disclosed in the Lupo patent exhibit significant disadvantages, and are not practically capable for commercial use in the preparation of direct imaging, transfer lettering or, pre-press proofs.

Substantial disadvantages are found in the commercially available formulation of the Lupo patent compared with the preferred formulations of this invention. First, the formulation of the Lupo patent is less viscous and when a substrate is coated by placing it in a conventional whirler it dries unevenly and leaves mottled areas having different color densities. Furthermore, the exposed coating of the prior art patent tends to wash away more easily than the exposed coating in accordance with this invention after a comparable amount of exposure to ultraviolet light. The Lupo method also uses a washing step involving abrasives and an ink which comprises casein which shortens the ink's shelf life.

The photosensitive emulsion or varnish of this invention requires less ultraviolet light exposure time to cure. Further, the exposed photosensitive coating of this invention may be washed with pure water to remove the non-cross-linked portions, rather than requiring an ammonium hydroxide solution for washing as in the prior art. Additionally the use of casein is not necessary, thus giving the ink of this invention an increased shelf life.

In Thompson, U.S. Pat. No. 4,737,436, a method of making color proofs of images is disclosed for use in high image resolution color photomechanical imaging. The method disclosed in the Thompson patent also exhibits significant disadvantages. One disadvantage involves the blending of pigments to produce a pigment of predetermined color. The color of a pigment, being a dried powder, generally is not the same as the color of the pigment dispersed in a vehicle, and thus, it is difficult to obtain true colors using the method of the Thompson patent. Another disadvantage is the requirement of the use of a nitrocellulose sealer, which is flammable and poses toxicological hazards to both person and property. Another disadvantage is the use of a diazo sensitizer which, when used in a proper manner, has a very short life time of approximately 10–20 days and does not have an extended shelf life.

The ink color of this invention is produced by blending dispersed pigments in the ink solution, rather than by blending dry pigment, resulting in a more true to life ink color. Further, due to the large number of nitrocellulose-based sealer coats commercially available, it may be difficult to select a coat which is most compatible with the desired ink formulation. The unique nitrocellulose-based sealer coat disclosed herein is formulated to be compatible with the ink formulation disclosed herein and the unique property of this coating is produced by the acid and the plasticizer which give it the necessary adhesion, flexibility and flow properties not only when applied to a substrate but also when the ink of this invention is applied over it. Additionally, this invention discloses a unique water-based sealer coat, which is compatible with the ink formulation disclosed herein, which is a suitable alternative to nitrocellulose-based sealer coats.

In Kreiter, U.S. Pat. No. 4,710,447, a method and ink solution used for producing color proofs is disclosed which uses a powder coat which acts as a matting layer or bonding agent for the ink solution. The powder coat is applied to the sealer coat so as to dull the sealer finish and make the ink solution more adherent to the sealer coat. This powder coat is a disadvantage in that first, it requires an extra step and extra ingredient in the method, thus increasing complexity. Second, a specific sealer must be selected which creates a coat compatible with the selected powder coat. An additional disadvantage of the Kreiter patent is the ink formulation which will not lay down on the sealer coat without the use of the powder coat.

The ink formulation of this invention is compatible with both the known nitrocellulose-based sealer coats and the water-based sealer coat disclosed herein without the need for a powder coat, or any additional matting or adhering agent. The lack of need of such additional coats or agents reduces the complexity of both the color proofing process and the physical structure of the color proof of this invention when compared to the prior art. Further, the ink formulation of this invention will lay down on known nitrocellulose-based sealer coats and the water-based sealer coat disclosed herein.

The prior art formulations are applied, in their commercially available forms, by hand application to a backing by the whirler process. It is then dried by conventional methods after which a photographic negative is laid over the coating which is on a substrate and is exposed to ultraviolet light. After the desired exposure period, the negative is then removed and the portions of the coating underneath the transparent parts of the negative are rendered insoluble. When the negative is removed, the substrate with a particular color which has just been exposed is washed with a dilute ammonia solution to remove the portions of the applied coating which were not rendered insoluble by exposure to ultraviolet light.

Prior art formulations using nitrocellulose-based products, which are not water soluble, as a sealer coat, pose significant toxicological hazards to both person and property. After the nitrocellulose-based sealer coat is applied and dried, the only method for removing a portion or all of the sealer coat is by using a solvent, such as acetone. The disadvantages of the use of such a nitrocellulose-based sealer coat are numerous, including the cost and the health and environmental hazards inherent in a red label explosive vapor material such as nitrocellulose when used in a non-explosion proof and poorly ventilated color proofing shop environment.

Prior art processes used commercially in producing pre-press proofs consist of expensive mechanical equipment and involve the use of micropulverized pigmented material which is applied to a sensitized flexible film by hand or some mechanical means. Then the proper negative is placed over the flexible film which has the color applied and is exposed to ultraviolet light. After exposure the negative is removed and the applied color on the sensitized flexible film is developed. Successive sensitized films are used, each having its specific color. When the required number of flexible films are developed they are laminated after they are placed in register; however, the laminations cause a gloss and depth of image which is not achieved when the job is actually printed.

SUMMARY OF THE INVENTION

The method of this invention comprises the steps of selecting a suitable backing substrate and a sealer coat, such as the unique water-based sealer coat or nitrocellulose-based sealer coat disclosed herein, mechanically applying the sealer coat to a backing (including metal, glass, paper, polyester, ect.) surface using a rod. The sealer coat is dried, and then a uniform layer of the water-based varnish mixture disclosed herein is applied by means of a wire wound rod over the sealer coat, the mixture containing a selected pigmented color dispersion and sufficient water solubulized organic resins to form a film on drying. The mixture also contains either an alkali dichromate salt or aromatic diazo compound commonly used in the printing art. The organic resins are selected from the group consisting of polyvinyl alcohol, polyvinyl acetate, acrylic polymers, silicone acrylics, acrylated urethanes, and protein-based hydrolysates such as casein. The alkali dichromate salt is selected from the group consisting of a sodium dichromate, potassium dichromate, and ammonium dichromate, and any of the various aromatic diazo compounds, such as diazo salts, are appropriate. The pigment containing varnish of this invention retains a more true to life quality than the blend of dried pigments disclosed in the prior art.

A selected photographic negative image is pressed against the dried uniform pigmented layer and exposed to ultraviolet radiation for cross-linking the applied coating and the dichromate salt. Following exposure, the negative is removed and the cured film is washed with potable water to remove the non-cross-linked portions thereof. The backing and exposed developed coating is now dried. The image which has been developed is a reproduction of the photograph from which the negative was made. This process can be repeated any number of times using different color pigments in the water-based varnish photoresist so as to produce a multi-colored image.

When either the water-based seal coat or the nitrocellulose seal coat is applied and dried and then the pigmented organic resin mixture is applied to a flexible film backing and a photographic negative is placed over the coating, and the coating exposed, washed, and dried in the same manner as mentioned above, one has produced the colored image of a potential transfer. The flexible backing sheet may have natural or inherent release properties, or may be coated with a silicone release agent, to facilitate the method. The application of this invention to non-silicone-based backing sheets is important as silicone-based backing sheets are not suitable for all color proofing systems. In order to cleanly transfer this image the sealer coat should be removed. Then a thin layer of adhesive is applied to the entire sheet over the exposed cured image and the flexible backing is then placed on the substrate with the image contacting the surface to which one wishes to transfer. By rubbing with a burnishing tool the image will leave the silicone treated surface and adhere to the pre-selected new surface. Transfer imaging has now been accomplished.

One advantage of this invention is that the photosensitive coating when exposed and developed produces a sharper image with finer lines resulting in a more detailed colored image.

Another advantage of this invention is that several colors can be applied in successive steps using different negatives made from the color separation process.

Another advantage of this invention is the use of the water-based sealer coat disclosed herein in place of conventional nitrocellulose-based sealer coats, thus providing a less hazardous method and product.

Another advantage of this invention when using the water-based sealer coat is that a complete imaging system which is based entirely on water and is non-flammable is created.

As each color is deposited, developed, and dried and the next color deposited progressively in this manner as many times as the entire sets of negatives require and using the appropriate color on the negative separations, the entire original image, or art picture can be reproduced as a direct image. These steps are all accomplished by applying colored vehicle over the same base coat. This process is known as multi-color direct imaging.

In addition, another unique use of this invention is to color match the primary colored coatings prior to using them so that they are the same density and hue as the Standard Web Offset Printing (SWOP) standard color chips, as circulated to the printing industry as standards; or any other conventionally used color standards. Using the precisely controlled color coating, it is possible to make repeated identical reproductions of the initial process colored photograph and hence the standard for the commercial press run of this product. This state of the art is known as "pre-press proof".

Accordingly, it is an object of the present invention to create a water-based system which can be cast onto various substrates so as to produce a colored image by using a pigmented colored water-based photosensitive coating and a photographic negative.

Another object of the present invention is to create a colored image on a substrate, from a single negative. This negative being made from the entire artwork common to the art design industry.

Another object of the present invention is to create a colored image on a selected substrate, from several negatives, each negative being a principal part of a composite photograph that has been recorded on photographic film.

Another object of the present invention is to provide a system which is capable of producing a duplicate of the original color photograph, using the separation negatives of the original and by using the four primary color inks applied and processed in sequence.

Another object of the present invention is to produce a pre-press proof using a water-based system.

Another object of the present invention is to provide a system which avoids the necessity of using hazardous sealers such as those comprising nitrocellulose.

Another object of the present invention is to produce a pre-press proof which more closely resembles the image of its commercially printed form, by using pigmented coatings which contain the same selection of pigments as found in the inks used in printing the picture.

Another object of the present invention is to be able to transfer the color image to any type of material, e.g. paper, vinyl, styrene, wood or metal.

Another object of the present invention is to produce a photosensitive coating or varnish having decreased curing time.

Another object of the present invention is to produce a color image having improved sharpness and overall quality.

Another object of the present invention is to produce a reproducible film thickness by using a number eleven (11 mm diameter of wire wound on a suitable rod) rod when coating a substrate. In addition, using a larger numbered rod than a number eleven rod when a heavier wet film giving a greater density of color is desired, and conversely using a smaller numbered rod when a thinner wet film is desired giving a less dense color.

Another object of this invention is to produce a photosensitive colored liquid mixture which is stable over extended periods of time and only under adverse conditions is a bactericide added in order to prevent bacteriological degradation.

Other objects, features, and advantages of the present invention will become apparent from the following description.

DESCRIPTION OF THE PREFERRED EMBODIMENTS

Referring now in detail to the steps of the method of the present invention, one mechanically applies onto a flexible backing a uniform layer of a pigment free sealer coat. The flexible backing may be a silicone treated styrene-based stock or any other suitable material of appropriate size, including acrylic, mylar, vinyl, acetate or metallic substrates such as aluminum foil or uncoated, or semi-coated paper stocks. It is preferable when producing a transfer that the flexible backing have an applied, natural or inherent release means. Flexible backings with natural or inherent release means are preferred in those color proofing systems which operate better in the absence of silicone.

The sealer coats of this invention are selected from the unique nitrocellulose-based sealer coat disclosed below or a water-based sealer coat.

The nitrocellulose-based sealer coat used in this invention comprises a unique mixture of components which greatly reduces the noxious odor emanating from known nitrocellulose-based sealer coats. By replacing the majority of the acetates in the solution with alcohols, the noxious odor is reduced. The nitrocellulose-based sealer coat of this invention comprises the following ingredients, with the amount of each ingredient being expressed in percent by weight:

| | |
|---|---|
| ethyl alcohol (anhydrous) 99% | 19.0 percent |
| isopropyl alcohol (anhydrous) | 6.0 percent |
| n-propyl alcohol | 10.0 percent |
| ethyl acetate 99% | 10.0 percent | mix the above ingredients then add the following ingredients while mixing:

| | |
|---|---|
| dioctyl phthalate | 4.8 percent |
| nitrocellulose solution | 50.0 percent |
| citric acid | 0.2 percent |
| TOTAL | 100.0% |

The nitrocellulose solution comprises the following ingredients, also being expressed in percent by weight:

| | |
|---|---|
| 30–35 cps. SS nitrocellulose (dry) | 35.0 percent |
| isopropyl alcohol (wetting alcohol) | 15.0 percent |
| ethyl alcohol (anhydrous) 99% | 40.0 percent |
| n-propyl acetate | 10.0 Percent |
| TOTAL | 100.0% |

The nitrocellulose used in the above formula is the one that is preferred, but one can use either an RS or SS type dry nitrocellulose, nor is one limited to the viscosity of either type of nitrocellulose, nor is one limited to the above solvents or diluents used, but the citric acid and plasticizer ratio to the dry nitrocellulose should be held within ten percent (10%) of the above formula for the desired characteristics. Whatever solvents or diluents are used must not be detrimental to the backing to which the coating is applied and the coating must produce a clear transparent film.

The nitrocellulose-based sealer coat is squirted onto the backing in a straight line along the top edge. A coating rod is placed above the applied liquid coating and drawn towards the bottom edge of the backing material in a smooth, even motion. The coating is dried with a conventional forced warm air dryer or other suitable means until completely dry to the touch.

The unique water-based sealer coat of this invention comprises the following ingredients, with the amount of each ingredient being expressed in percent by weight:

| | |
|---|---|
| JONCRYL 586 Resin Solution | 7.5 percent |
| JONCRYL 537 Acrylic Polymer | 13.5 percent |

| | |
|---|---|
| Water | 7.5 percent |
| Butyl carbitol | 1.5 percent |
| Q-Thane QW-4195 Urethane Emulsion | 70.0 percent |
| TOTAL | 100.0% |

The above JONCRYL 586 resin solution comprises the following ingredients also being expressed in percent by weight:

| | |
|---|---|
| Water | 51.0 percent |
| N-Propyl Alcohol | 15.0 percent |
| Ammonia 28° Baume | 4.0 percent |
| JONCRYL 586 Resin Flake | 30.0 percent |
| TOTAL | 100.0% |

The unique water-based seal coat described herein is unique because it produces a very fast drying coating which is water insoluble when dried and when coated with a solution having a pH in the range of from about 2.0 to about 9.5 is very resistant to resolubility. Currently available water-based seal coats dry very slowly and after drying are susceptible to resolubalization in the above-mentioned pH range and do not produce the required water resistance.

To make the water-based seal coat the JONCRYL 586 resin solution must be made as follows: Heat the water to about 150° F. in a suitable vessel equipped with an agitator. Add the N-propyl alcohol and the ammonia 28° Baumé to the water. Under high speed agitation, slowly add the JONCRYL 586 resin flake. When all the resin flake has been added, run the mixer at a medium speed for about 30 minutes or until all of the resin flake is completely dissolved. Then, let the mixture cool to about 80° F. and adjust the pH using 28° Baumé ammonia to a reading of about pH 9 at 75° F.

To this JONCRYL 586 resin solution add in the following order, in a mixing vessel using moderate agitation: the JONCRYL 537 acrylic polymer, then the water, then the butyl carbitol, then the Q-Thane QW-4195 urethane solution.

The water-based sealer coat is applied to the backing in the same manner as the nitrocellulose-based sealer coat. That is, by depositing a bead of the water-based seal coat across the top of the selected substrate and then, by using a coating rod, draw this wet bead of liquid towards the bottom edge of the backing material in a smooth, even motion so that the entire backing material is coated with the water-based seal coat. The coating is dried with a conventional forced warm air dryer or other suitable means until completely dry to the touch.

This water-based sealer coat is used as a replacement for the solvent-based nitrocellulose-based sealer coat primarily to eliminate the flammability and the personal toxicological hazards associated with the usage of a red label explosive vapor material in a non-explosion proof and, many times, poorly ventilated color proofing shop environment. The water-based sealer coat acts similar to the nitrocellulose-based sealer coat in that it forms a base coat on the preselected proofing substrate, which will accept the photosensitive pigmented coating, and provide a water impervious surface under repeated washings during the development stages in the proofing process.

The water-based sealer coat is made by mixing together an alkaline resistant acrylic resin solution, an alkaline resistant acrylic emulsion polymer and a urethane emulsion. When properly blended in the above stated proportions, a seal coat which has a high degree of alkaline water resistance is produced. This is important because one series of photosensitive pigmented coatings of this invention has an ammonium dichromate added as a sensitizer and are used at an alkaline pH of about 7.1 to about 8.5. Most water-based acrylic resins, when applied as a sealer coat, will soften or redissolve when overcoated with a film or pigmented photosensitive coating at a pH of about 7.1 or higher.

JONCRYL 586 solid acrylic resin flake and JONCRYL 537 thermoplastic styrene/acrylic emulsion polymer are available from S. C. Johnson & Son, Inc., Racine, Wisconsin 53403. Q-Thane QW-4195 urethane emulsion is available from K. J. Quinn & Co., 137 Folley Mill Road, Seabrock, N.H. 03874.

The selected water-based colored pigmented coatings are then mechanically applied to the backing. In some instances it may be desirable to apply a coating of opaque white ink prior to application of the desired colored pigmented coatings to provide a background which contracts with the image. The pigments are dispersed in a water-based varnish comprising a sufficiently dispersed organic resin to form a film on drying and an alkali dichromate salt, preferably ammonium dichromate but also possibly including sodium dichromate, potassium dichromate, or a dichromate salt of an amine or quaternary ammonium radical. Alternatively, a diazo compound, such as Diazo Salt #7 or Diazo Salt #LZ-7 sold by Charkit Chemicals Corp. of Darien, Conn., may be substituted for the alkali dichromate salt.

Broadly, it is contemplated to use any organic resin which is susceptible to a cross-linking reaction with an alkali dichromate salt or a diazo compound under ultraviolet light exposure. Typical examples of organic resins which may he used are artificial resins such as polyvinyl alcohol, polyvinyl acetate, acrylic polymers, silicone acrylics, acrylated urethanes, and protein based resins such as casein. The dissolved resin is preferably present in the varnish and dispersion mixture 25 to 75 times greater quantity by percent weight than the dissolved dry dichromate salt, which constitutes a substantial reduction in the amount of dichromate salt present when compared with the prior art. As the result of this, the pigment-free varnish layer exhibits less color tint (caused by the dichromate salt) than that of the prior art, which helps in obtaining the pure color value desired when colored pigment dispersion is added to the varnish.

An example of the above resin vehicle is made by first producing a base polyvinyl alcohol vehicle including the following ingredients, with the amount of each ingredient being expressed in percent by weight:

| | |
|---|---|
| de-ionized water | 86.0 percent |
| Polyviol G 18-140 | 10.0 percent |
| ethylene glycol | 4.0 percent |
| TOTAL | 100.0% |

This base polyvinyl alcohol vehicle is prepared by putting the de-ionized water into a vessel which has an agitator and which can be heated. Slowly add the Polyviol G 18-140 resin under agitation to prevent lumping of the resin. Next, slowly heat this mixture, while agitating, to 185° F. and hold at this temperature for about 40 minutes. Next, cool the mixture to 140° F. and add the ethylene glycol. Allow the mixture to cool to ambient temperature.

From this base polyvinyl alcohol vehicle, a phthalo blue dispersion is produced by mixing the following ingredients, with the amount of each ingredient being expressed in percent by weight:

| | |
|---|---|
| Base Polyvinyl alcohol vehicle | 79.5 percent |
| Heubach BT617 Phthalo Blue Pigment | 10.0 percent |
| de-ionized water | 5.5 percent |
| isopropyl alcohol | 4.8 percent |
| surfynol GA | 0.2 percent |
| TOTAL | 100.0% |

An ammonium dichromate sensitizer solution can be prepared by using the following ingredients, with the amount of each ingredient being expressed in percent by weight:

| | |
|---|---|
| de-ionized water | 70.5 percent |
| Ammonium Bichromate | 17.5 percent |
| Ammonium Hydroxide 28° Baume | 12.0 percent |
| TOTAL | 100.0% |

To make the ammonium dichromate sensitizer solution, first put the de-ionized water in a suitable container. Next, add the ammonium dichromate and agitate the solution until the ammonium dichromate is entirely dissolved. Next, add the ammonium hydroxide 28° Baumé until the pH is between about 8.5 and 8.8.

Using the base polyvinyl alcohol vehicle, the phthalo blue dispersion and the sensitizer solution, SWOP standards can be made. Example SWOP standards are as follows, with the amount of each ingredient being expressed in percent by weight:

| | |
|---|---|
| Base polyvinyl vehicle | 76.0 percent |
| Surfynol GA | 0.2 percent |
| de-ionized water | 16.9 percent |
| Phthalo Blue Dispersion | 5.5 percent |
| Ammonium Bichromate Sensitizer Solution | 1.4 percent |
| TOTAL | 100.0% |
| Base Polyvinyl Vehicle | 79.0 percent |
| Surfynol GA | 0.2 percent |
| de-ionized water | 9.0 percent |
| 419-5092 Rubine (Red) Dispersion | 9.5 percent |
| Ammonium Bichromate Sensitizer Solution | 2.3 percent |
| TOTAL | 100.0% |

The rubine red dispersion is made as follows, with the amount of each ingredient being expressed in percent by weight:

| | |
|---|---|
| Base Polyvinyl Vehicle | 56.0 percent |
| 419-5092 Rubine Presscake at 55% solids | 18.2 percent |
| de-ionized water | 22.6 percent |
| Surfynol GA | 0.2 percent |
| Isopropyl Alcohol | 3.0 percent |
| TOTAL | 100.0% |

The polyvinyl alcohol Polyviol G 18–140 is available from Wacker Chemicals, Inc., 50 Locust Avenue, New Canaan, Conn. 06840. The Heubach BT-617 Phthalo Blue Pigment is available from Heubach, Heubach Avenue, Newark, N. J. 07114. The Surfynol GA is available from Air Products and Chemicals, Inc., P.O. Box 538, Allentown, Pa. 18105. The 419–5092 Rubine Press Cake is available from Sun Chemical Corp. Pigments Division, 411 Sun Avenue, Cincinnati, Ohio 45232.

Whenever the procedure outlined above is used, utilizing the base polyvinyl alcohol vehicle as the main ingredient and a dispersion of a dry or presscake pigment is produced, the dispersion is produced using a steel ball mill which is run for 48 hours and then discharged. When producing dispersions of light yellow pigments, a sand mill is used however, all pigments can be dispersed using a sand mill which in the case of yellow pigments does not change the color because of steel contamination. The sensitized pigmented coatings described above utilize the ammonium dichromate sensitizing solution adjusted after compounding to a final alkalinity of about pH 8.5 using ammonium hydroxide 28° Baumé.

When using the method of producing a sensitized pigmented coating employing a diazo sensitizer, the base polyvinyl alcohol vehicle and the rubine (red) magenta dispersion described above can be used in the following general type of formula. The Diazo sensitizing solution comprises the following ingredients, with the amount of each ingredient being expressed in percent by weight:

| | |
|---|---|
| Diazo #7 | 5.4 percent |
| de-ionized water | 94.6 percent |
| TOTAL | 100.0% |

Note: The diazo #7 used in this formula can be substituted with diazo SSK, SS, 7LZ and produces the same results. The use of Diazo #4 is also interchangable in this sensitizing solution.

Diazo #7, also known as Diazon-7, and Diazon 7-LZ are manufactured by Charkit Chemical Corp. of Darien, Conn. Diazon-7 and Diazon-7-LZ are both trade names for chlorozincate, polymenthylene p-diazodiphenylamine. Diazo SSK and Diazo SS are manufactured by Molecular Rearrangement, Inc. of Newton, N.J. Diazo SSK and Diazo SS are trade names for benzene diazonium, 4-(phenylamine)-phosphate (1:1) polymer with formaldehyde. Diazo #4 is a trade name for 4-(phenylamine)-benzene diazonium polymer with formaldehyde, zinc chloride. Diazo #4 is manufactured by Fairmount Chemical Co., Inc. of Newark, N.J.

In producing a pigmented photosensitive coating using a diazo as a sensitizer, the following mixture could be produced, with the amount of each ingredient being expressed in percent by weight:

| | |
|---|---|
| Base polyvinyl alcohol vehicle | 77.3 percent |
| Surfynol GA | 0.2 percent |
| de-ionized water | 9.0 percent |
| 419-5092 Rubine dispersion | 9.5 percent |
| Diazo sensitizing solution | 4.0 percent |
| TOTAL | 100.0% |

Final pH of coating is pH 3.5.

Using a polyvinyl acetate to produce a pigmented photosensitive coating, the following mixture should be used, with the amount of each ingredient being expressed in percent by weight:

| | |
|---|---|
| Polyvinyl acetate DPN36 Emulsion | 43.0 percent |
| de-ionized water | 43.0 percent |
| Polyvinyl Alcohol Rubine (Red) Magenta dispersion | 10.0 percent |
| Diazo sensitizing solution | 4.0 percent |
| TOTAL | 100.0% |

The above coating has a pH of about 4.5.

Diazo #7 and diazo SSK, SS, 7L2 are products of Charkit Chemical Corp., 1063 Post Road, Darion, Conn. 06820. Diazo #4 is a product of Fairmount Chemical Co., Newark, N.J. 07105. Polyvinyl Acetate DPN36 Emulsion is a product of Wacker Chemicals, Inc., 50 Locust Avenue, New Canaan, Conn. 06840.

The uniform layer of water-based varnish containing the colored pigment dispersion may he applied onto the backing by the use of a conventional wire-wound rod, preferably with a winding wire having a diameter of about 5 to about 18 mils. Wire-wound rods are commercially available expressly for the purpose of placing uniform liquid coatings on a backing.

The uniform layer is then dried, for example, with a forced warm air dryer of conventional design or any other suitable means. The drying step is accelerated by using a hot air blower. Following the drying step, the uniform colored layer on the backing is pressed against a selected transparent negative image such as a photographic screened or lined negative or a half-tone negative. The two members are held together preferably by vacuum suction or other mechanical means for intimate, facing contact. Any pigment area not covered by the film negative should be masked. Thereafter, the negative is exposed to actinic radiation, particularly ultraviolet radiation, which passes through transparent areas of the negative image causing cross-linking of the organic resin, typically polyvinyl alcohol, polyvinyl acetate, acrylic polymers, silicone acrylics, acrylated urethanes, and casein and the like, and when an alkali dichromate salt is used as a sensitizer, the pigmented colored coating must be adjusted to a pH of from about 7.1 to about 8.5. However, when a diazo compound is used as the sensitizer, the pigmented colored coating will have a pH of between about 3.5 and about 6.5. A one to three minute application of ultraviolet light has proven to be quite adequate when emitted from a 2 kilowatt metal halide ultraviolet source such as is conventionally used in plate making.

Following the ultraviolet light radiation step, the backing and cured emulsion layer is separated from the negative, unexposed ink is removed by gently rubbing the surface of the backing with a water saturated paper towel and then washing with water to remove the non-cross-linked portions of the emulsion. Unlike the preferred formulations, the water does not have to be buffered on the alkaline side with ammonia or the like, but simple tap water or deionized water may be used for a substantial savings in cost.

If desired, the above process can be repeated any number of times using different colors of pigment dispersed in the water based varnish so as to produce multi-colored, multi-layered images.

When a transfer is desired, the above described process is applied to a silicone coated backing sheet, or a backing sheet which has natural or inherent release properties, and, after the last pigmented coating is developed with water, the surface is dried. The nitrocellulose-based sealer coat is removed by wetting a soft foam strip with acetone and drawing the strip over the cured emulsion applying moderate pressure for the entire distance and then drying the image area with a warm air dryer. The entire surface of the backing sheet is coated with adhesive using the same technique and rod as used for applying the seal coat. After the adhesive has dried, the image is ready to be transferred onto any desirable substrate. Satisfactory results are obtained using a 30% solution of A 673 adhesive diluted with acetone. This material is available from Advance Process Supply Company, Chicago, Ill.

The water-based polyvinyl alcohol varnish of this invention when used with a diazo salt sensitizing solution has a pH of from about 3.5 to about 6.5; however, the water-based polyvinyl alcohol varnish of this invention when used in conjunction with an ammonium dichromate sensitizer solution is generally maintained within a pH range of from about 7.0 to about 9.0 by using selected pH controlling agents. It is particularly preferred to use a mixture of ammonium hydroxide and an organic amine having a boiling point of at least 100° C. The organic amine should be present in an amount capable of imparting a pH of 7.0 to the varnish in the absence of the ammonium hydroxide. By way of example, organic amines which may be used in this invention include: 2-dimethylamino-2-methyl-1-propanol (which contains 20% added water as DMAMP80); 2-amino-2-methyl-1-propanol (which contains 5% added water as AMP-95); or the group of amines represented by diethylamino ethanol.

When the water-based pigmented emulsion or varnish mixture containing a dichromate sensitizing solution is placed on the backing and dried, the ammonium hydroxide is removed by evaporation. However, because the organic amine is sufficiently less volatile than water, it remains to impart latent alkaline conditions to the film and to facilitate the process of developing after ultraviolet exposure. During the washing step, some of the organic amine may remain to facilitate dissolving of the resin. Furthermore, as stated above, the rate of cure under ultraviolet radiation and the separation of the soluble portions of the resin layer from the insoluble portions is greatly facilitated by the use of this procedure.

It is generally preferable for the emulsion and pigmented varnish of this invention to include from 5 to 20 percent by weight of resin and from 0.1 to 1.0 percent by weight of ammonium dichromate. It is also generally preferable for the weight of dissolved dry resin present to be from 25 to 75 times greater in quantity than the weight of the dissolved dry ammonium dichromate therein.

It is also preferable for the pigmented emulsion or varnish mixture of this invention to have a viscosity range, as measured by a commercially available No. 2 Zahn cup, of 30 to 60 seconds at 72° F. and more particularly of about 40 to 55 seconds at 72° F.

The acrylic polymer of this invention may be mixed as desired with dry pigment or pigment press cake to provide a formulation of 8 to 20 percent by weight of any desired dry pigment (and typically 10 percent by weight), 1 to 5 percent by weight of a defoaming agent (typically a volatile organic solvent such as isopropanol) to prevent foaming during the process of milling in the dry pigment, with the balance of the material comprising the base varnish described above. Alternatively, the dry pigments can be mixed with the defoaming agent and water prior to adding to the varnish. This mixture can be milled in a steel ball mill or porcelain lined pebble mill or any other suitable dispersing equipment, until completely uniform to provide an aqueous pigment dispersion ready for mixing with the base varnish in desired proportions to accurately match the desired color for use in the preparation of color imaging.

The addition of a small amount of coalescing agent is also desirable, for example from 0.5 to 2 percent by weight, and typically about 0.5 percent by weight of a polyether solvent such as Cellosolve or Carbitol. This helps to impart desirable synergistic properties to the pigment dispersion producing a homogeneous state with the emulsion or varnish mixture.

One specific embodiment of the clear varnish of this invention comprises the following ingredients, present in water dispersion, with the amount of each ingredient being expressed in percent by weight:

EXHIBIT A

| | |
|---|---|
| organic resin or casein | 10.0 percent |
| ammonium hydroxide (concentrated) | 0.2 percent |
| amine | 0.1 percent |
| coalescing agent such as Cellosolve or Carbitol | 0.5 percent |
| water | 89.2 percent |
| | 100.0% |

This clear varnish material may then be mixed with a pigment dispersion in the acrylic polymer to provide differing colors and color intensities as desired, and to serve as the coating for color imaging according to the process described above, or for other photoreproduction techniques as may be desired.

By way of example, various aqueous pigment dispersions may be prepared by mixing together the ingredients as set forth in Table 1.

TABLE I

Aqueous Pigment Dispersions

| Pigment | Ingredient | Percent by Weight |
|---|---|---|
| DLARYLIOE YELLOW | AAA diarylide yellow presscake[1] (50% solids) | 20.0 |
| | Joncryl 74F[2] | 60.0 |
| | Water | 15.0 |
| | Isopropyl Alcohol (anhydrous) | 5.0 |
| | | 100.0 |
| RUBINE RED | Lithol Rubine pigment[3] | 10.0 |
| | Joncryl 74F | 70.0 |
| | Water | 20.0 |
| | | 100.0 |
| PHTHALO BLUE | Phthalo blue presscake[4] (40% solids) | 45.0 |
| | Joncryl 74F | 55.0 |
| | | 100.0 |
| CARBON BLACK | Regal 99R carbon black pigment[5] | 10.0 |
| | Joncryl 74F | 70.0 |
| | Carbitol | 0.5 |
| | Water | 19.5 |
| | | 100.00 |

[1]Available from Hilton Davis, Cincinnati, Ohio as C-68-C-102
[2]Styrenated acrylic copolymer 48% solids, available from S. C. Johnson, Racine, Wisconsin
[3]Available from Hilton Davis as 10-6C-65F334
[4]Available from Hilton Davis as 10-6C-65-F315, Peacoline Blue
[5]Available from Cabot Corp.

The red, blue and black aqueous dispersion mixtures were ground in steel ball mills for 24 hours. The yellow aqueous dispersion mixture was ground in a porcelain jar mill for 24 hours. This method produces uniform dispersions by reducing the pigment agglomerates to very fine particles, thus yielding optimum gloss, transparency and coating capability.

The photosensitive inks were prepared by mixing the ingredients as indicated in Table II.

TABLE II

Aqueous Photosensitive Inks

| Color | Ingredients | Percent by Weight | Viscosity (Sec. #2 Zahn) (@ 72° F.) |
|---|---|---|---|
| YELLOW | Diarylide Yellow Dispersion[1] | 15.0 | 55 |
| | Resin Solution[2] | 55.0 | |
| | Water | 30.0 | |
| | | 100.0 | |
| RED | Rubine Red Dispersion[1] | 15.0 | 53 |
| | Resin Solution[2] | 55.0 | |
| | Water | 30.0 | |
| | | 100.0 | |
| BLUE | Phthalo Blue Dispersion[1] | 13.0 | 55 |
| | Resin Solution[2] | 55.0 | |
| | Water | 32.0 | |
| | | 100.0 | |
| BLACK | Carbon black Dispersion[1] | 15.0 | 52 |
| | Resin Solution[2] | 55.0 | |
| | Water | 30.0 | |
| | | 100.0 | |
| FLUOR- ESCENT ORANGE | Fluorsescent Orange Pigment[3] | 16.7 | 50 |
| | Resin Solution[2] | 48.0 | |
| | Joncryl 74F | 8.3 | |
| | Water | 27.0 | |
| | | 100.0 | |

[1]See Table I
[2]See Exhibit A for resin solution
[3]Available from Magruder Co. Sunset Orange, 319, JS-503019

Typically, to each 100 gm ink solution (See Table II) 0.1 to 5.0 gm of a 20% by weight solution of ammonium dichromate is added, which has been adjusted previously to a pH of 8.5 with concentrated ammonium hydroxide, commonly known in the industry as 28 Baumé. The ammonium dichromate functions as a photosensitizer which reacts with the resin solids in the finished dry ink film when exposed to ultraviolet light to form water insoluble cross-links at the point of exposure.

The product of this invention can be used on glass, metal, paper, synthetics such as polyester, vinyl and polycarbonate and plastic materials as the substrates, but it is not limited to these substrates.

The series of colored images produced by this invention can be used to reproduce the original color picture taken by the photographer. These same negatives can be used to produce printing plates for several different printing processes such as Offset, Flexo and Letter Press to mention a few. However, it is not the printing process which is the important element of this invention, rather it is the colored images obtained from the negatives that are used to produce the printing plates. This process is known as a pre-press proof.

This invention uses a combination of a varnish (resin or polymer in some type of solution), a pigment dispersion (pigment in a resin solution having been dispersed in some type of mill), ammonium dichromate or a diazo compound (as a sensitizer), water and other chemicals to produce a pigmented, photosensitive coating which is made insoluble by ultraviolet light exposure. Any of the pigmented, photosensitive coatings produced by this invention can be mixed with each other, providing the same type of sensitizer solution is used, to color match whatever color is selected or desired for the final photoimaging product. To make a colored picture using the separation negatives, colored photosensitive coatings matched to S.W.O.P. standards must be used to ensure that the separation negatives used will produce the original color picture. Hence, the pigment in the water pigment dispersion retains its original color which is color matched to a prescribed color so that the color in the varnish after exposure to actinic light and after drying is substantially the same color as the prescribed color.

The above examples have been offered for illustrative purposes only, and are not intended to limit the invention of this application, which is as defined in the claims below.

What is claimed is:

1. An acidic water-based varnish for use in the production of colored images on a backing from a transparent negative image comprising: water, a water-based color pigment dispersed in said water to form a dispersion, said pigment having an original color, which is color matched to a prescribed color, sufficient dispersed organic resin to form a colored film on drying, and an aromatic diazo compound that will cross-link with said organic resin upon exposure to actinic light, said pigment being present in greater quantity by weight than said compound, such that the color of said varnish after exposure to actinic light and after drying is substantially the same color as said prescribed color.

2. The water-based varnish of claim 1 in which the organic resin is selected from the group consisting of protein-based resins, polyvinyl alcohol, silicone acrylics, acrylated urethanes, polyvinyl acetate and acrylic polymer solutions and mixtures thereof, the pH of said water-based varnish being from about 3.5 to 6.5.

3. The water-based varnish of claim 1 in which said varnish mixture has a viscosity range by a No.2 Zahn cup of 30 to 60 seconds at 72° F.

4. The water-based varnish of claim 1 in which said aromatic diazo compound is a diazo salt.

5. A water-based varnish for use in the production of colored images by ultraviolet light exposure of a dried layer of said varnish comprising: water, a pigmented resin having a prescribed color dispersed in said water, said water-based varnish comprising from about 5 to about 20% by weight of organic resin, from about 0.1 to about 1.0% by weight of an aromatic diazo compound that will cross-link with said resin upon exposure to ultraviolet light, said resin being present in a greater quantity than said compound, said varnish having a final pH of from about 3.5 to about 6.5 the color of said water-based color pigment dispersion after said exposure to actinic light being substantially the same as said original color.

* * * * *